United States Patent
Harnik et al.

(10) Patent No.: US 9,225,355 B2
(45) Date of Patent: *Dec. 29, 2015

(54) BOOSTING DECOMPRESSION IN THE PRESENCE OF REOCCURRING HUFFMAN TREES

(71) Applicant: GlobalFoundries U.S. 2 LLC, Hopewell Junction, NY (US)

(72) Inventors: Danny Harnik, Tel Mond (IL); Ety Khaitzin, Holon (IL); Sergey Marenkov, Yehud (IL); Dmitry Sotnikov, Givataim (IL)

(73) Assignee: GlobalFoundries Inc., Grand Cayman (KY)

( * ) Notice: Subject to any disclaimer, the term of this patent is extended or adjusted under 35 U.S.C. 154(b) by 0 days.

This patent is subject to a terminal disclaimer.

(21) Appl. No.: 14/694,831

(22) Filed: Apr. 23, 2015

(65) Prior Publication Data

US 2015/0229326 A1 Aug. 13, 2015

Related U.S. Application Data

(63) Continuation of application No. 14/059,404, filed on Oct. 21, 2013, now Pat. No. 9,059,731.

(51) Int. Cl.
| | | |
|---|---|---|
| H03M 7/40 | (2006.01) | |
| G06F 11/00 | (2006.01) | |
| G11B 20/14 | (2006.01) | |
| H03M 7/30 | (2006.01) | |

(52) U.S. Cl.
CPC ............... *H03M 7/40* (2013.01); *G06F 11/00* (2013.01); *H03M 7/6005* (2013.01); *H03M 7/6058* (2013.01); *G11B 20/1419* (2013.01); *H03M 7/30* (2013.01)

(58) Field of Classification Search
CPC ....... H03M 7/40; H03M 7/30; G11B 20/1419
USPC .................. 341/65, 67, 106, 52; 382/232
See application file for complete search history.

(56) References Cited

U.S. PATENT DOCUMENTS

| 8,593,308 B1 | 11/2013 | Biran et al. |
| 2009/0058693 A1 | 3/2009 | Laker et al. |

FOREIGN PATENT DOCUMENTS

| EP | 1233522 A1 | 2/2003 |
| WO | 2009005758 A2 | 1/2009 |

OTHER PUBLICATIONS

Spi Dst, et al., Bounding the Depth of Search Trees, Mar. 30, 2007, 27 pgs, Software Patent Institute.
Spi Dst, et al., Extension of the Huffman Tree Construction Algorithm, Apr. 23, 2007, 43 pgs, Software Patent Institute.
Lv et al., Fast DCT Algorithm on Video Controller's Realization, 4 pgs, vol. 12, No. 3, Electric Machines and Control, China.

*Primary Examiner* — Joseph Lauture

(57) ABSTRACT

For boosting decompression in the presence of reoccurring Huffman trees, a previous Huffman tree is used to decompress a new data block if a match is identified between a compacted description of the Huffman tree and a recently used Huffman tree compaction.

20 Claims, 6 Drawing Sheets

BOOSTING DECOMPRESSION IN THE PRESENCE OF REOCCURRING HUFFMAN TREES

CROSS-REFERENCE TO RELATED APPLICATIONS

This application is a Continuation of U.S. patent application Ser. No. 14/059,404, filed on Oct. 21, 2013.

BACKGROUND OF THE INVENTION

1. Field of the Invention

The present invention relates generally to computers, and more particularly, to boosting decompression in the presence of reoccurring Huffman trees in a computing storage environment.

2. Description of the Related Art

In today's society, computer systems are commonplace. Computer systems may be found in the workplace, at home, or at school. Computer systems may include data storage systems, or disk storage systems, to process and store data. In recent years, both software and hardware technologies have experienced amazing advancement. With the new technology, more and more functions are added and greater convenience is provided for use with these electronic appliances. One of the most noticeable changes introduced by recent computer technology is the inclusion of images, video, and audio to enhance the capabilities of computing systems. In the age of multimedia, the amount of information to be processed increases greatly. One popular method of handling large data files is to compress the data for storage or transmission. Therefore, processing very large amounts of information is a key problem to solve. Therefore, a need exists to improve the efficiency of data compression.

SUMMARY OF THE DESCRIBED EMBODIMENTS

Various embodiments are provided for boosting decompression in the presence of reoccurring Huffman trees in a computing environment. In one embodiment, by way of example only, a method comprises using a previous Huffman tree to decompress a new data block if a match is identified between a compacted description of the Huffman tree and a recently used Huffman tree compaction.

In addition to the foregoing exemplary method embodiment, other exemplary system and computer product embodiments are provided and supply related advantages. The foregoing summary has been provided to introduce a selection of concepts in a simplified form that are further described below in the Detailed Description. This Summary is not intended to identify key features or essential features of the claimed subject matter, nor is it intended to be used as an aid in determining the scope of the claimed subject matter. The claimed subject matter is not limited to implementations that solve any or all disadvantages noted in the background.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict embodiments of the invention and are not therefore to be considered to be limiting of its scope, the invention will be described and explained with additional specificity and detail through the use of the accompanying drawings, in which.

DESCRIPTION OF CERTAIN EMBODIMENTS

Figure 1:
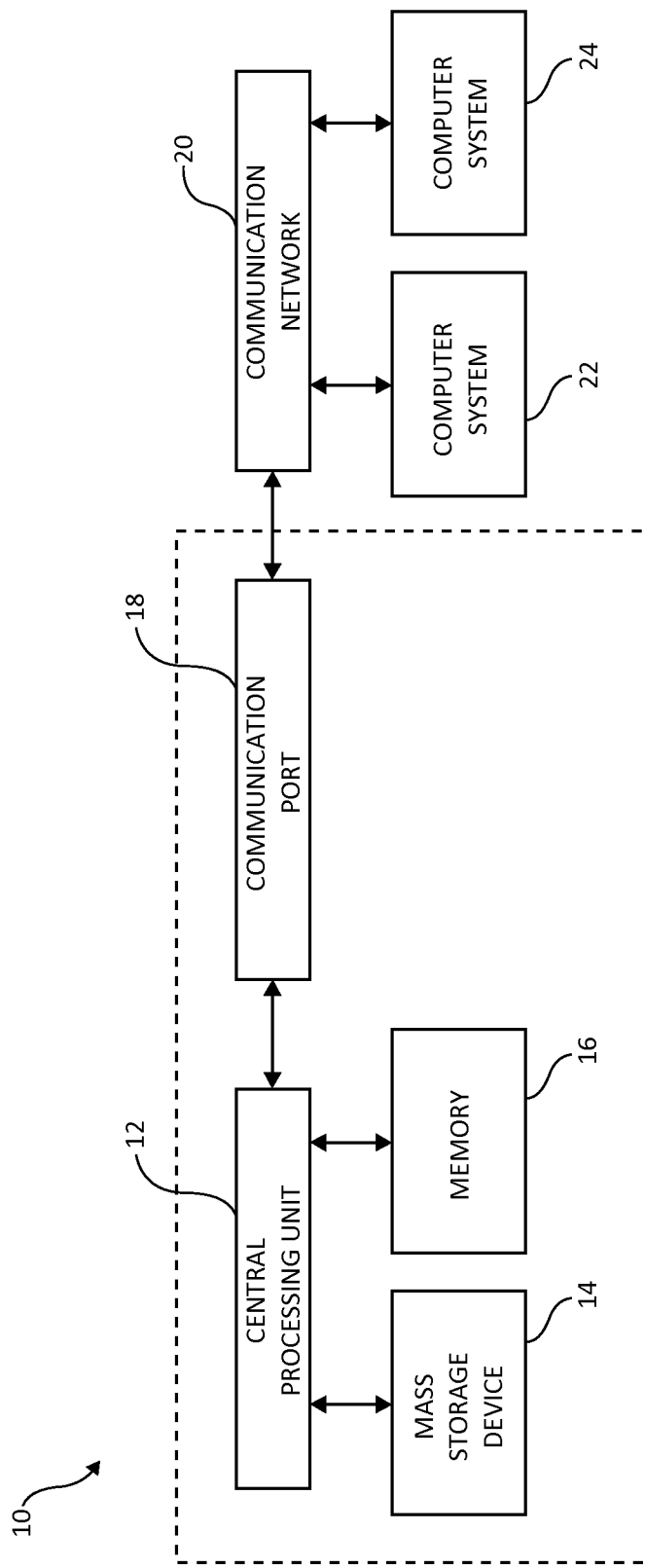
FIG. 1 illustrates a computer storage environment having an example storage device in which aspects of the present invention may be realized.

With increasing demand for faster, more powerful and more efficient ways to store information, optimization of storage technologies is becoming a key challenge. Logical data objects (data files, image files, data blocks, etc.) may be compressed for transmission and/or storage. Data compression techniques may be used to reduce the amount of data to be stored and/or transmitted in order to reduce the storage capacity and/or transmission time respectively. In one embodiment, Huffman trees may be used over and over, which reduces computing efficiency and yields a slower decompression of data that was compressed using a limited/reoccurring set of Huffman trees. Thus, a need exists for boosting decompression in the presence of reoccurring Huffman trees in a computing environment. In other words, the present invention provides dramatic improvement in the decompression of data that was compressed using limited and/or reoccurring sets of Huffman trees.

In one embodiment, Deflate may be used, which is a lossless data compression algorithm defined in RFC 1951 with compression/decompression standards being supported by a variety of browsers and accelerators. Deflate uses a combination of the Lempel-Ziv algorithm (LZ77) that eliminates repetitions and Huffman coding. In one embodiment, a variety of implementations to the Deflate standard in software and hardware are provided (e.g., Zlib compressors). The Deflate standard consists of employing two distinct compression algorithms sequentially: first a repetition finding Lempel-Ziv algorithm (LZ77) type compression followed by a Huffman encoding compression. The Huffman encoding is entropy encoding that is based on a "Huffman tree". In order to Huffman encode and decode data, a system must know in advance that the Huffman tree is being used. In order to accommodate decompression (e.g., an "Inflate" operation), this Huffman tree is written at the header of every compressed block. In one embodiment, there are two options for Huffman trees in the Deflate standard. One is a "static" tree, which is a single hard-coded Huffman tree, known to all compressors and decompressors. The advantage of using this static tree is that its description does not have to be written in the header of a compressed block, and is ready for immediate decompression. On the other hand "dynamic" trees are tailored for the data block at hand and an exact description of the dynamic tree must therefore be written to the output.

In one embodiment, Huffman encoding may use a variable-length code table based on entropy to encode source symbols, and as previously mentioned, is defined either as either static or dynamic. In static Huffman coding, each literal or distance is encoded using a fixed table (SHT) that is defined in the RFC. In dynamic Huffman coding, however, special coding tables (DHT) are constructed to better suit the statistics of the data being compressed. In most cases, using DHT achieves better compression ratio (e.g., quality) when compared to SHT, at the expense of degrading the compression rate (e.g., performance) and adding design complexity. The static and dynamic Huffman encoding methods best reflect the built-in tradeoff between compression rate and ratio. The static Huffman method achieves a lower compression ratio than is possible. This is due to using a fixed encoding table regardless of the content of the input data block. For example, random data and a four-letter DNA sequence would be encoded using the same Huffman table.

Using dynamic Huffman encoding improves the compression ratio in comparison to using static Huffman encoding, but is typically time consuming and requires complex hardware. One solution to improve the compression ratio, while maintaining efficient performance, is to analyze the first part of the incoming data stream and speculatively select a predefined preset dictionary to be used on the entire data (instead of a generic static dictionary). A high level of correlation is found between the statistics of files with similar nature (e.g., two English text files). Such a level of correlation is exploited to compose predefined DHT presets. A matching preset yields the best of both worlds: a close-to DHT compression ratio with close-to SHT compression rate. This approach provides a setting with a limited reoccurring set of Huffman trees being used.

It should be noted that every data block has a header that (among other things) indicates if the data block used dynamic or static tree for the Huffman encoding. If the tree was dynamic then the header also includes a compacted description of the Huffman tree to be used for the Inflate on the corresponding block. Deflate standard writes the Huffman tree in a compacted manner (to optimize the overall output size). During Inflate (e.g., decompression), the compacted tree description is first read and then opens the compacted tree and prepares the appropriate data structures for using the Huffman tree, and only then can start the actual decompression process. This tree building and preparation process is time consuming and therefore, data compressed with dynamic trees tend to have substantially slower decompression speeds than data compressed with the static tree. This discrepancy in decompression time becomes more acute when the write blocks are smaller, since a dynamic tree is written for each write block. During Inflate, the overhead of tree preparation is higher since each tree encodes less user data. Still, dynamic Huffman trees are beneficial since the compression ratio they provide is typically much better than that of the static tree. Note that using Deflate on small writes is becoming more important with the introduction of real-time compression on primary data systems. In some Deflate implementations, a small set of Huffman trees may be reused over and over. This is beneficial when the data being compressed is homogenous in nature—one does not have to invest in many tree builds during the compression, yet homogenous data can still benefit (in terms of compression ratio) from a single Huffman tree over large portions of data. For example, an English text can usually get good compression ratios using a single dedicated Huffman tree for this language (same goes to any other language). Still, in order to be compatible with the standard, this specialized tree must be written at the header of every compressed block. However, reusing the Huffman trees over and over reduces computing efficiency and yields a slower Inflate speed of data that was compressed using a limited/reoccurring set of Huffman trees.

Thus, a need exists for boosting the Inflate speed in the presence of reoccurring Huffman trees in a computing environment. In other words, the present invention provides dramatic improvement in the Inflate speed of data that was compressed using limited and/or reoccurring sets of Huffman trees. In one embodiment, by way of example only, an encoded Huffman tree is compared to recently used Huffman tree compactions for identifying matches rather than reconstructing a Huffman tree from a header of a compressed block for each data block to avoid overhead of a Huffman tree reconstruction.

In one embodiment, by way of example only, rather than reconstructing a Huffman tree from the header of a compressed block for every block, the present invention first compares an encoded tree (e.g., encoded Huffman tree) to recently used tree compactions. When a match is found the present invention avoids the overhead of tree reconstruction. The present invention boosts the performance of Inflate in the aforementioned cases of reoccurring trees. Yet the Inflate implementation of the present invention remains compatible with the Deflate standard in cases where Huffman trees do not repeat and with negligible effect on the performance.

In one embodiment, by way of example only, the present invention augments the standard Inflate implementations in the following way. First, when reading a compressed block, the header is checked to see if the header is encoded with a dynamic Huffman tree. If so, before reading the compacted tree description, the present invention checks/determines if a previous tree exists in the Inflate process's memory. If a previous tree exists, the compacted description of the previous tree is compared to the compacted description inside the header of the new block. If there is a match, the present invention uses the previous tree to decompress the new block (this saves the time of de-compaction and preparation of a new tree for the new block). If a match does not exist, a new tree is prepared according to the compacted description in the header of the new block, and the present invention additionally keeps a reference of the compacted description of the new tree of the new block. Note that the length of a tree compaction is unknown in advance, and the only way to learn the length is to actually de-compact this tree. To cope with this, in one embodiment, the present invention stores the length of the compaction of the previous tree, and compares this compaction with the same number of bits from the designated location in the header of the new block. By the nature of the compaction operation (e.g., it is prefix-free), this comparison guarantees to answer positively on exact matches and to return a mismatch for any two non-identical trees.

In one embodiment, by way of example only, the present invention keeps/maintains a number of previous trees (e.g., previous Huffman trees) in cache (memory) and compares the tree in the new header to each one of the stored trees. This is appropriate for implementations that during Deflate choose Huffman trees from a bank of available trees. In one embodiment, by way of example only, the present invention prepares a data structure, such as a binary search tree, for the set of cached Huffman trees. This is possible since the Huffman tree descriptions are prefix-free. During Inflate, a user/application may use this specialized data structure (e.g., the binary search tree) to find a matching Huffman tree. This will reduce the overhead required to compare the new Huffman tree's description to all the previous Huffman trees in the cache.

In one embodiment, by way of example only, the present invention uses a previous Huffman tree (e.g., previously created and/or a previously used Huffman tree) to decompress a new data block if a match is identified between the encoded Huffman tree and one of the recently used Huffman tree compactions. The header of the compressed block is checked to determine if the header is encoded with a dynamic Huffman tree. In one embodiment, by way of example only, the present invention determines if a previous Huffman tree exists in memory for an Inflate operation prior to reading a compacted description of the previous Huffman tree if the header is encoded with the dynamic Huffman tree, and compares the compacted description of the previous Huffman tree to a compacted description of the header of a new data block if the previous Huffman tree exists in the memory for the Inflate operation.

In one embodiment, by way of example only, a new Huffman tree is prepared according to the header and maintains a reference of a compacted description of the header of a new data block.

In one embodiment, by way of example only, the present invention decompacts a Huffman tree (and a length of a tree compaction may be determined while decompacting), stores the length of the tree compaction of a previous Huffman tree, and/or compares the length of the tree compaction with a same number of bits from a designated location in the header of a new data black for ensuring the matching is exact and returning any mismatches for any two non-identical Huffman trees.

In one embodiment, by way of example only, the present invention maintains previous Huffman trees in cache and compares a new Huffman tree in the header of a data block to each one of the previous Huffman trees stored in the cache and/or prepares a data structure for a set of the previous Huffman trees that stored in the cache, and the data structure is used for identifying the matches.

Turning to FIG. 1, an example computer system 10 is depicted in which aspects of the present invention may be realized. Computer system 10 includes central processing unit (CPU) 12, which is connected to mass storage device(s) 14 and memory device 16. Mass storage devices may include hard disk drive (HDD) devices, which may be configured in a redundant array of independent disks (RAID). The backup operations further described may be executed on device(s) 14, located in system 10 or elsewhere. Memory device 16 may include such memory as electrically erasable programmable read only memory (EEPROM) or a host of related devices. Memory device 16 and mass storage device 14 are connected to CPU 12 via a signal-bearing medium. In addition, CPU 12 is connected through communication port 18 to a communication network 20, having an attached plurality of additional computer systems 22 and 24. The computer system 10 may include one or more processor devices (e.g., CPU) to execute and perform each operation described herein to accomplish the purposes of the present invention.

Figure 2A:
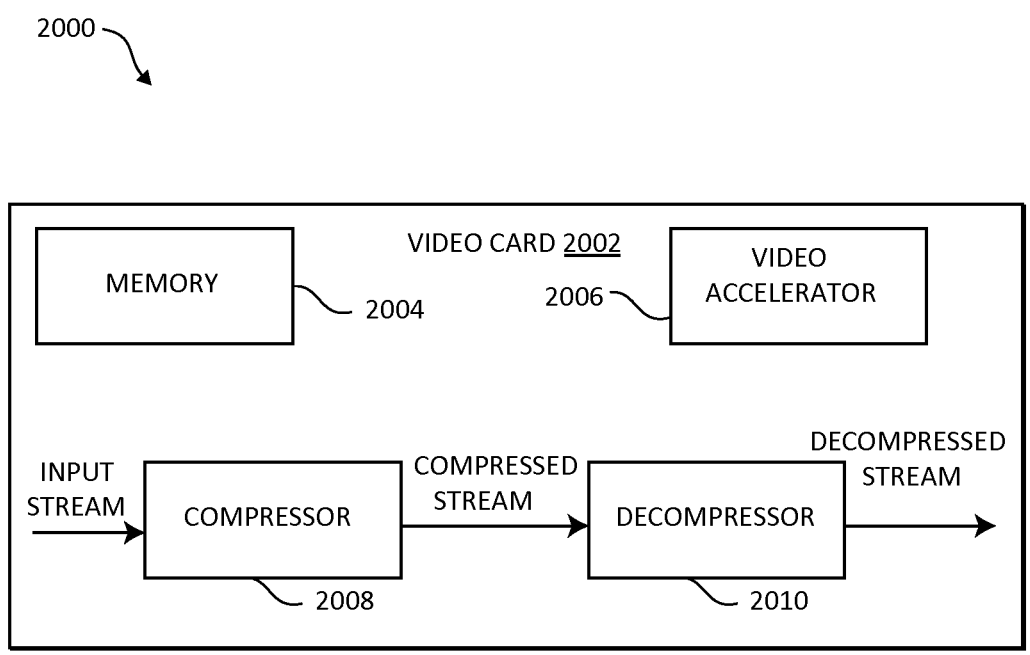
FIG. 2A illustrates an exemplary block diagram showing a hardware structure of a data compression system in a computer system in which aspects of the present invention may be realized.

FIG. 2A illustrates an exemplary block diagram showing a hardware structure of a data compression system in a computer system in which aspects of the present invention may be realized. A compressor 2008 receives an input stream of data bytes and outputs a compressed stream in a video card 2002 having a memory 2004 and a video accelerator 2006. In one embodiment, the description of FIG. 2A of the video card 2002 may also be a graphics accelerator card 2002, a float-point accelerator card 2002, a game console card 2002, a mobile phone chipset 2002, a video display controller 2002, a GPU duster 2002, a data stream unit 2002, a data processing unit 2002, and the like. A decompressor 2010 receives the compressed stream and outputs a decompressed stream that is identical to the input stream. In one embodiment, the video card 2002, video accelerator 2002, the compressor 2008, and decompressor 2010 may be implemented on a computer system comprising a central processing unit, a memory, and input/output devices (see FIG. 1 and FIG. 2B). In alternate embodiments, the compressor 2008 and decompressor 2010 are implemented using a special-purpose computer system or using discrete logic devices. The compressor 2008 and decompressor 2010 may be used to compress and decompress various types of data including data stored in memory, stored on disk, or transmitted on a communications channel. The compressed stream output by the compressor 2008 can be either stored for later decompression or transmitted to a remote location where it is decompressed. The decompressor 2010 may include a LZ77 decoder (not shown). The LZ77 decoder outputs the single byte decoded from each literal to the decompressed stream.

Figure 2B:
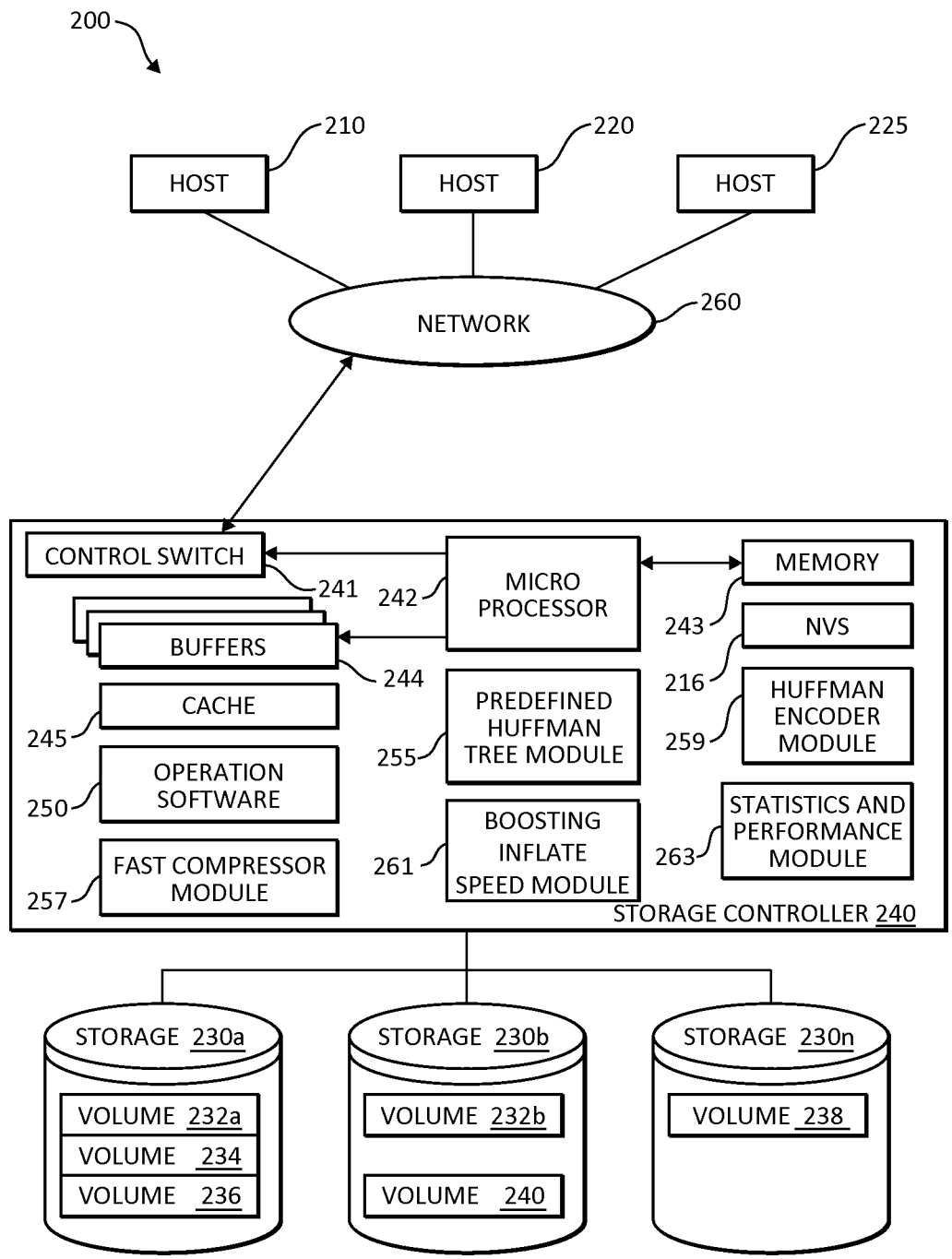
FIG. 2B illustrates an exemplary block diagram showing a hardware structure of a data storage system in a computer system in which aspects of the present invention may be realized.

FIG. 2B is an exemplary block diagram 200 showing a hardware structure of a data storage system in a computer system according to the present invention. Host computers 210, 220, 225, are shown, each acting as a central processing unit for performing data processing as part of a data storage system 200. The cluster hosts/nodes (physical or virtual devices), 210, 220, and 225 may be one or more new physical devices or logical devices to accomplish the purposes of the present invention in the data storage system 200. In one embodiment, by way of example only, a data storage system 200 may be implemented as IBM® ProtecTIER® deduplication system TS7650G™. A Network connection 260 may be a fibre channel fabric, a fibre channel point to point link, a fibre channel over ethernet fabric or point to point link, a FICON or ESCON I/O interface, any other I/O interface type, a wireless network, a wired network, a LAN, a WAN, heterogeneous, homogeneous, public (i.e. the Internet), private, or any combination thereof. The hosts, 210, 220, and 225 may be local or distributed among one or more locations and may be equipped with any type of fabric (or fabric channel) (not shown in FIG. 2) or network adapter 260 to the storage controller 240, such as Fibre channel, FICON, ESCON, Ethernet, fiber optic, wireless, or coaxial adapters. Data storage system 200 is accordingly equipped with a suitable fabric (not shown in FIG. 2) or network adaptor 260 to communicate. Data storage system 200 is depicted in FIG. 2 comprising storage controllers 240 and cluster hosts 210, 220, and 225. The cluster hosts 210, 220, and 225 may include cluster nodes.

To facilitate a clearer understanding of the methods described herein, storage controller 240 is shown in FIG. 2 as a single processing unit, including a microprocessor 242, system memory 243 and nonvolatile storage ("NVS") 216. It is noted that in some embodiments, storage controller 240 is comprised of multiple processing units, each with their own processor complex and system memory, and interconnected by a dedicated network within data storage system 200. Storage 230 (labeled as 230a, 230b, and 230n in FIG. 3) may be comprised of one or more storage devices, such as storage arrays, which are connected to storage controller 240 (by a storage network) with one or more cluster hosts 210, 220, and 225 connected to each storage controller 240.

In some embodiments, the devices included in storage 230 may be connected in a loop architecture. Storage controller 240 manages storage 230 and facilitates the processing of write and read requests intended for storage 230. The system memory 243 of storage controller 240 stores program instructions and data, which the processor 242 may access for executing functions and method steps of the present invention for executing and managing storage 230 as described herein. In one embodiment, system memory 243 includes, is in association with, or is in communication with the operation software 250 for performing methods and operations described herein. As shown in FIG. 2, system memory 243 may also include or be in communication with a cache 245 for storage 230, also referred to herein as a "cache memory", for buffering "write data" and "read data", which respectively refer to write/read requests and their associated data. In one embodiment, cache 245 is allocated in a device external to system memory 243, yet remains accessible by microprocessor 242 and may serve to provide additional security against data loss, in addition to carrying out the operations as described in herein.

In some embodiments, cache 245 is implemented with a volatile memory and non-volatile memory and coupled to microprocessor 242 via a local bus (not shown in FIG. 2) for enhanced performance of data storage system 200. The NVS 216 included in data storage controller is accessible by microprocessor 242 and serves to provide additional support for operations and execution of the present invention as described in other figures. The NVS 216, may also referred to as a "persistent" cache, or "cache memory" and is implemented with nonvolatile memory that may or may not utilize external power to retain data stored therein. The NVS may be stored in and with the cache 245 for any purposes suited to accomplish the objectives of the present invention. In some embodiments, a backup power source (not shown in FIG. 2), such as a battery, supplies NVS 216 with sufficient power to retain the data stored therein in case of power loss to data storage system 200. In certain embodiments, the capacity of NVS 216 is less than or equal to the total capacity of cache 245.

Storage 230 may be physically comprised of one or more storage devices, such as storage arrays. A storage array is a logical grouping of individual storage devices, such as a hard disk. In certain embodiments, storage 230 is comprised of a JBOD (Just a Bunch of Disks) array or a RAID (Redundant Array of Independent Disks) array. A collection of physical storage arrays may be further combined to form a rank, which dissociates the physical storage from the logical configuration. The storage space in a rank may be allocated into logical volumes, which define the storage location specified in a write/read request.

In one embodiment, by way of example only, the storage system as shown in FIG. 2 may include a logical volume, or simply "volume," may have different kinds of allocations. Storage 230a, 230b and 230n are shown as ranks in data storage system 200, and are referred to herein as rank 230a, 230b and 230n. Ranks may be local to data storage system 200, or may be located at a physically remote location. In other words, a local storage controller may connect with a remote storage controller and manage storage at the remote location. Rank 230a is shown configured with two entire volumes, 234 and 236, as well as one partial volume 232a. Rank 230b is shown with another partial volume 232b. Thus volume 232 is allocated across ranks 230a and 230b. Rank 230n is shown as being fully allocated to volume 238—that is, rank 230n refers to the entire physical storage for volume 238. From the above examples, it will be appreciated that a rank may be configured to include one or more partial and/or entire volumes. Volumes and ranks may further be divided into so-called "tracks," which represent a fixed block of storage. A track is therefore associated with a given volume and may be given a given rank.

The storage controller 240 (and/or other hardware component associated and controlled by a processor device which may not be illustrated in FIG. 2 but used/employed by one of ordinary skill in the art) may include a predefined Huffman tree module 255, a fast compressor module 257, a Huffman Encoder module 259, a boosting Inflate speed module 261, and a statistics and performance module 263. The predefined Huffman tree module 255, the fast compressor module 257, the Huffman encoder module 259, the boosting Inflate speed module 261, and the statistics and performance module 263 may work in conjunction with each and every component of the storage controller 240, the hosts 210, 220, 225, and storage devices 230. The predefined Huffman tree module 255, the fast compressor module 257, the Huffman encoder module 259, the boosting Inflate speed module 261, and the statistics and performance module 263 may be structurally one complete module or may be associated and/or included with other individual modules. The predefined Huffman tree module 255, the fast compressor module 257, the Huffman encoder module 259, the boosting Inflate speed module 261, and the statistics and performance module 263 may also be located in the cache 245 or other components.

The storage controller 240 includes a control switch 241 for controlling the fiber channel protocol to the host computers 210, 220, 225, a microprocessor 242 for controlling all the storage controller 240, a nonvolatile control memory 243 for storing a microprogram (operation software) 250 for controlling the operation of storage controller 240, data for control, cache 245 for temporarily storing (buffering) data, and buffers 244 for assisting the cache 245 to read and write data, a control switch 241 for controlling a protocol to control data transfer to or from the storage devices 230, the data duplication module 255, the similarity index module 257, and the similarity search module 259, in which information may be set. Multiple buffers 244 may be implemented with the present invention to assist with the operations as described herein. In one embodiment, the cluster hosts/nodes, 210, 220, 225 and the storage controller 240 are connected through a network adaptor (this could be a fibre channel) 260 as an interface i.e., via at least one switch called "fabric."

In one embodiment, the host computers or one or more physical or virtual devices, 210, 220, 225 and the storage controller 240 are connected through a network (this could be a fibre channel) 260 as an interface i.e., via at least one switch called "fabric." In one embodiment, the operation of the system shown in FIG. 2 will be described. The microprocessor 242 may control the memory 243 to store command information from the host device (physical or virtual) 210 and information for identifying the host device (physical or virtual) 210. The control switch 241, the buffers 244, the cache 245, the operating software 250, the microprocessor 242, memory 243, NVS 216, predefined Huffman tree module 255, the fast compressor module 257, the Huffman encoder module 259, the boosting Inflate speed module 261, and the statistics and performance module 263 are in communication with each other and may be separate or one individual component(s). Also, several, if not all of the components, such as the operation software 250 may be included with the memory 243. Each of the components within the devices shown may be linked together and may be in communication with each other for purposes suited to the present invention. As mentioned above, the predefined Huffman tree module 255, the fast compressor module 257, the Huffman encoder module 259, the boosting Inflate speed module 261, and the statistics and performance module 263 may also be located in the cache 245 or other components. As such, the predefined Huffman tree module 255, the fast compressor module 257, the Huffman encoder module 259, the boosting Inflate speed module 261, and the statistics and performance module 263 maybe used as needed, based upon the storage architecture and users preferences.

As previously mentioned, rather than reconstructing a Huffman tree from the header of a compressed block for every block, the present invention compares the encoded Huffman tree to a recently used tree compactions to avoid the overhead of tree reconstruction. This enables the use of a previous Huffman tree to decompress the new block (note: this saves the time of de-compaction and preparation of a new tree for the new block). If there is no existing match, a new tree is prepared according to the header, and additionally keeps a reference of the compacted description of this tree for the next time.

Figure 3:
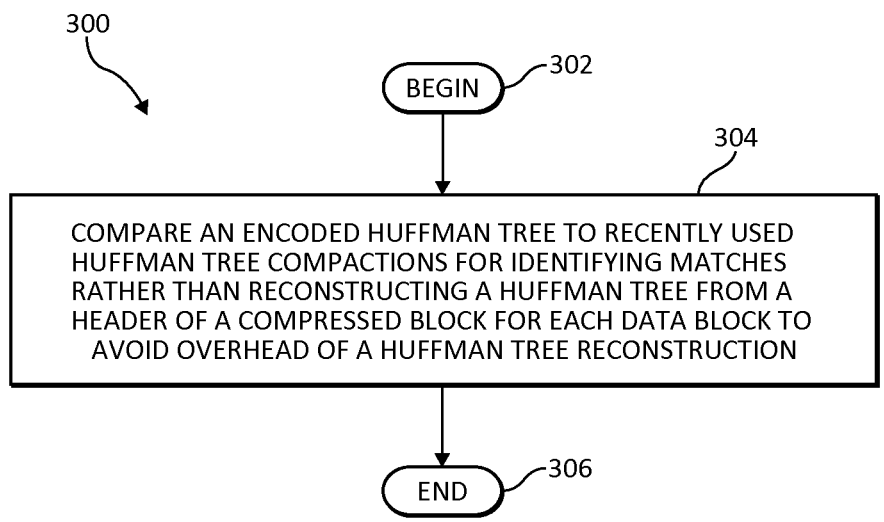
FIG. 3 is a flowchart illustrating an exemplary method for boosting Inflate speed in the presence of reoccurring Huffman trees in which aspects of the present invention may be realized.

Turning now to FIG. 3, a flowchart illustrating an exemplary method 300 for boosting Inflate speed in the presence of reoccurring Huffman trees in which aspects of the present invention may be realized is depicted. The method 300 begins (step 302) and compares an encoded Huffman tree to recently used Huffman tree compactions for identifying matches rather than reconstructing a Huffman tree from a header of a compressed block for each data block to avoid overhead of a Huffman tree reconstruction (step 304). The method 300 ends (step 306).

Figure 4:
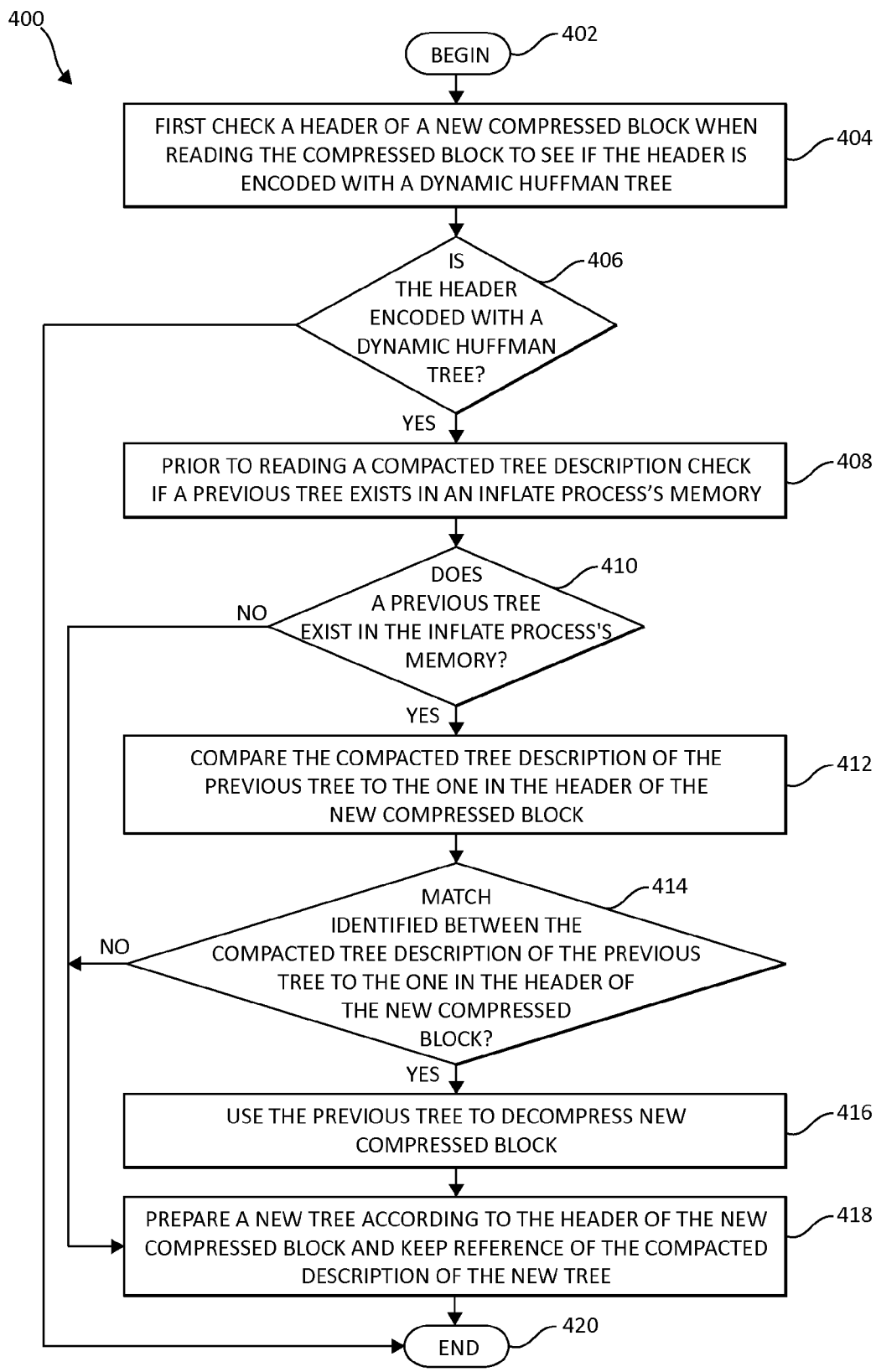
FIG. 4 is a flowchart illustrating an additional exemplary method for boosting Inflate speed in the presence of reoccurring Huffman trees in which aspects of the present invention may be realized.

Turning now to FIG. 4, a flowchart illustrating an additional exemplary method 400 for boosting Inflate speed in the presence of reoccurring Huffman trees in which aspects of the present invention may be realized is depicted. The method 400 begins (step 402) by first checking a header of a new compressed block when reading the compressed block to see if the header is encoded with a dynamic Huffman tree (step 404). The method 400 determines if the header is encoded with a dynamic Huffman tree (step 406). If no, the method 400 ends (step 420). If yes, prior to reading a compacted tree description, the method 400 checks if a previous tree exists in an Inflate process's memory (step 408). The method 400 determines and/or identifies if a previous tree exist in the Inflate process's memory (step 410). If no, the method 400 goes to (step 418). If yes, the method 400 compares the compacted tree description of the previous tree to the one in the header of the new compressed block (step 412). The method 400 determines if a match is identified between a compacted tree description of the previous tree to a compacted tree description in the header of the new compressed block (step 414). If yes, the method 400 uses the previous tree to decompress new compressed block (step 416). If no, the method 400 prepares a new tree according to the header of the new compressed block and keeps a reference of the compacted description of the new tree (step 418). The method 400 ends (step 420).

Figure 5:
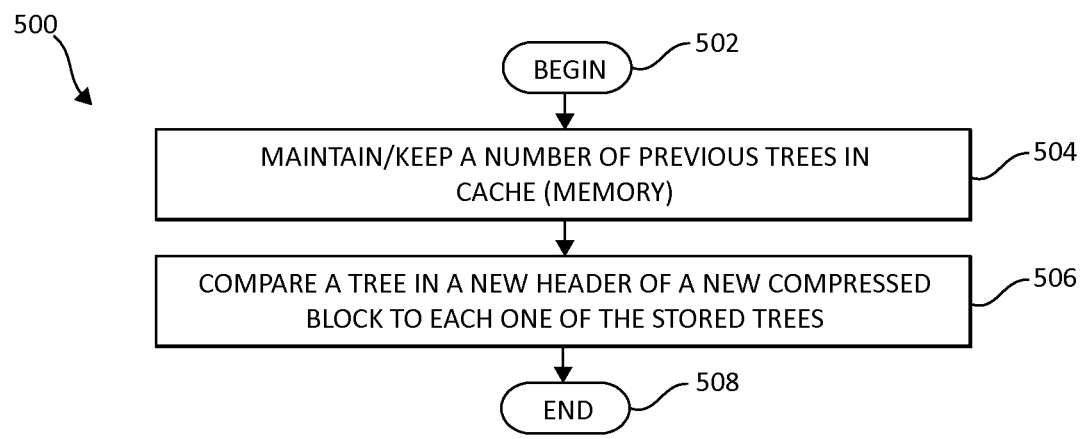
FIG. 5 is a flowchart illustrating an additional exemplary method for boosting Inflate speed in the presence of reoccurring Huffman trees in which aspects of the present invention may be realized.

Also, in conjunction with the method described in FIG. 4, an alternative embodiment illustrated in FIG. 5 may be used in conjunction with FIG. 4 with the various steps implemented in FIG. 5 being incorporated as needed by a user/application for additional enhancements to FIG. 4. Turning now to FIG. 5, a flowchart illustrating an additional exemplary method 500 for boosting Inflate speed in the presence of reoccurring Huffman trees in which aspects of the present invention may be realized is depicted. The method 500 begins (step 502) by maintaining/keeping a number of previous trees in cache (memory) (step 504). The method 500 then compares a tree in a new header of a new compressed block to each one of the stored trees (step 506). Note: this may be appropriate for implementations that during Deflate choose Huffman trees from a bank of available trees. The method 500 ends (step 508).

Thus, as illustrated in the FIGS. 1-5, the present invention provides for boosting inflate speed in the presence of reoccurring Huffman trees by comparing a compacted description of a Huffman tree to recently used Huffman tree compactions for identifying matches rather than reconstructing a Huffman tree from a header of a compressed block for each data block to avoid overhead of a Huffman tree reconstruction. In one embodiment, by way of example only, every compressed data block has a header that (among other things) indicates if the compressed data block used dynamic or static tree for the Huffman encoding. If it was dynamic then the header also includes a compacted description of the Huffman tree to be used for the Inflate on the corresponding block. A previous Huffman tree is used to decompress a new data block if a match is identified between the encoded Huffman tree and one of the recently used Huffman tree compactions. The header of the compressed block is checked to determine if the header is encoded with a dynamic Huffman tree. A determination is made if a previous Huffman tree exists in memory for an Inflate operation prior to reading a compacted description of the previous Huffman tree if the header indicates that the encoding is done with the dynamic Huffman tree. The compacted description of the previous Huffman tree is compared to a compacted description in the header of a new data block if the previous Huffman tree exists in the memory for the Inflate operation.

In one embodiment, by way of example only, a new Huffman tree is prepared according to the header and maintaining a reference of a compacted description of the header of a new data block, a length of the tree compaction is stored while preparing the new Huffman tree, decompacting a Huffman tree of a tree compaction, and/or the length of the tree compaction is compared with a same number of bits from a designated location in the header of a new data block for ensuring the matching is exact and returning any mismatches for any two non-identical Huffman trees. In one embodiment, the decompacting a Huffman tree is for preparing the new Huffman tree, and while decompacting, the length of the tree compaction may be stored.

In one embodiment, by way of example only, previous Huffman trees may be stored, kept, and/or maintained in cache, and the new Huffman tree in the header may be compared to each one of the previous Huffman trees stored in the cache. In one embodiment, by way of example only, a data structure may also be prepared and developed for a set of the previous Huffman trees stored in the cache. This newly created data structure may also be used for identifying the matches.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While one or more embodiments of the present invention have been illustrated in detail, the skilled artisan will appreciate that modifications and adaptations to those embodiments may be made without departing from the scope of the present invention as set forth in the following claims.

What is claimed is:

1. A method for boosting decompression in the presence of reoccurring Huffman trees by a processor device in a computing storage environment, the method comprising:
   using a previous Huffman tree to decompress a new data block if a match is identified between a compacted description of the Huffman tree and a recently used Huffman tree compaction.

2. The method of claim 1, further including comparing the compacted description of the Huffman tree to recently used Huffman tree compactions for identifying matches rather than reconstructing a Huffman tree from a header of a compressed block for each data block to avoid overhead of a Huffman tree reconstruction.

3. The method of claim 1, further including checking the header of the compressed block to determine if the header indicates that the encoding is done with a dynamic Huffman tree.

4. The method of claim 3, further including performing at least one of:
   determining if a previous Huffman tree exists in memory for an Inflate operation prior to reading a compacted description of the previous Huffman tree if the header indicates that the encoding is done with the dynamic Huffman tree, and comparing the compacted description of the previous Huffman tree to a compacted description in the header of a new data block if the previous Huffman tree exists in the memory for the Inflate operation.

5. The method of claim 1, further including performing at least one of:

preparing a new Huffman tree according to the header and maintaining a reference of a compacted description of the header of a new data block, and storing a length of the tree compaction while preparing the new Huffman tree.

6. The method of claim 1, further including performing at least one of:

decompacting a Huffman tree of a tree compaction, and comparing the length of the tree compaction with a same number of bits from a designated location in the header of a new data block for ensuring the matching is exact and returning any mismatches for any two non-identical Huffman trees.

7. The method of claim 1, further including maintaining previous Huffman trees in cache and comparing a compaction of a new Huffman tree in the header to each one of compactions of the previous Huffman trees stored in the cache.

8. The method of claim 7, further including preparing a data structure for a set of the compactions of the previous Huffman trees stored in the cache, wherein the data structure is used for identifying the matches.

9. A system for boosting decompression in the presence of reoccurring Huffman trees in a computing environment, comprising:

a processor device operable in the computing environment, wherein processor device:

uses a previous Huffman tree to decompress a new data block if a match is identified between a compacted description of the Huffman tree and a recently used Huffman tree compaction.

10. The system of claim 9, wherein the processor device compares the compacted description of the Huffman tree to recently used Huffman tree compactions for identifying matches rather than reconstructing a Huffman tree from a header of a compressed block for each data block to avoid overhead of a Huffman tree reconstruction.

11. The system of claim 9, wherein the processor device checks the header of the compressed block to determine if the header indicates that the encoding is done with a dynamic Huffman tree.

12. The system of claim 11, wherein the processor device performs at least one of:

determining if a previous Huffman tree exists in memory for an Inflate operation prior to reading a compacted description of the previous Huffman tree if the header indicates that the encoding is done with the dynamic Huffman tree, and comparing the compacted description of the previous Huffman tree to a compacted description in the header of a new data block if the previous Huffman tree exists in the memory for the Inflate operation.

13. The system of claim 9, wherein the processor device performs at least one of:

preparing a new Huffman tree according to the header and maintaining a reference of a compacted description of the header of a new data block, and storing a length of the tree compaction while preparing the new Huffman tree.

14. The system of claim 9, wherein the processor device performs at least one of:

decompacting a Huffman tree of a tree compaction, and comparing the tree compaction with a given length with a same number of bits from a designated location in the header of a new data block for ensuring the matching is exact, maintaining previous Huffman trees in cache and comparing a compaction of a new Huffman tree in the header to each one of compactions of the previous Huffman trees stored in the cache, and prepares a data structure for a set of the compactions of the previous Huffman trees stored in the cache, wherein the data structure is used for identifying the matches.

15. A computer program product for boosting decompression in the presence of reoccurring Huffman trees in a computing environment by a processor device, the computer program product comprising a non-transitory computer-readable storage medium having computer-readable program code portions stored therein, the computer-readable program code portions comprising:

a first executable portion that uses a previous Huffman tree to decompress a new data block if a match is identified between a compacted description of the Huffman tree and a recently used Huffman tree compaction.

16. The computer program product of claim 15, further including a second executable portion that compares the compacted description of the Huffman tree to recently used Huffman tree compactions for identifying matches rather than reconstructing a Huffman tree from a header of a compressed block for each data block to avoid overhead of a Huffman tree reconstruction.

17. The computer program product of claim 15, further including a second executable portion that checks the header of the compressed block to determine if the header indicates that the encoding is done with a dynamic Huffman tree.

18. The computer program product of claim 17, further including a third executable portion that performs at least one of:

decompacting a Huffman tree of a tree compaction, and comparing the tree compaction with a given length with a same number of bits from a designated location in the header of a new data block for ensuring the matching is exact, preparing a new Huffman tree according to the header and maintaining a reference of a compacted description of the header of a new data block, and storing a length of the tree compaction while preparing the new Huffman tree.

19. The computer program product of claim 15, further including a second executable portion that performs at least one of:

decompacting a Huffman tree for determining a length of a tree compaction, wherein the length of the tree compaction of a previous Huffman tree is stored, comparing the tree compaction with a given length with a same number of bits from a designated location in the header of a new data block for ensuring the matching is exact, and maintaining previous Huffman trees in cache and comparing a compaction of a new Huffman tree in the header to each one of compactions of the previous Huffman trees stored in the cache.

20. The computer program product of claim 15, further including a second executable portion that prepares a data structure for a set of the compactions of the previous Huffman trees stored in the cache, wherein the data structure is used for identifying the matches.

* * * * *